United States Patent
Kendzia, III et al.

(10) Patent No.: US 11,690,195 B2
(45) Date of Patent: Jun. 27, 2023

(54) POWER SEMICONDUCTOR COOLING SYSTEM

(71) Applicant: ABB Schweiz AG, Baden (CH)

(72) Inventors: Thomas Kendzia, III, Henrico, VA (US); Christopher Alan Belcastro, Mechanicsville, VA (US); Taylor Miller, Henrico, VA (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/018,235

(22) Filed: Sep. 11, 2020

(65) Prior Publication Data

US 2022/0087055 A1    Mar. 17, 2022

(51) Int. Cl.
*H05K 7/20* (2006.01)
*H01L 23/367* (2006.01)
*H01L 23/467* (2006.01)

(52) U.S. Cl.
CPC ..... *H05K 7/20154* (2013.01); *H01L 23/3672* (2013.01); *H01L 23/467* (2013.01); *H05K 7/20145* (2013.01); *H05K 7/20909* (2013.01)

(58) Field of Classification Search
CPC ........... H05K 7/20145; H05K 7/20136; H05K 7/20909–20918; H02B 1/56; H02B 1/565; H01L 23/467
USPC ......... 361/695–697, 676–678; 257/721–722; 454/184
See application file for complete search history.

(56) References Cited

U.S. PATENT DOCUMENTS

| | | | | |
|---|---|---|---|---|
| 4,682,268 A | * | 7/1987 | Okano | H05K 7/20154 361/697 |
| 6,219,266 B1 | * | 4/2001 | Pfauser | H02M 7/003 361/709 |
| 8,072,756 B1 | * | 12/2011 | Janes | H05K 7/20909 361/695 |
| 10,238,004 B2 | * | 3/2019 | Baran | H05K 7/20163 |
| 10,582,648 B2 | * | 3/2020 | Kurozaki | H05K 7/20154 |
| 2004/0256916 A1 | | 12/2004 | Reichle et al. | |
| 2008/0093730 A1 | | 4/2008 | Furuta | |
| 2009/0199997 A1 | | 8/2009 | Koplow | |
| 2009/0207639 A1 | | 8/2009 | Tanaka et al. | |
| 2010/0079944 A1 | | 4/2010 | Loth | |
| 2010/0296246 A1 | | 11/2010 | Kishimoto et al. | |
| 2013/0082377 A1 | | 4/2013 | Bennion et al. | |
| 2013/0134571 A1 | | 5/2013 | Kim et al. | |
| 2013/0314870 A1 | | 11/2013 | Kwak et al. | |
| 2013/0343001 A1 | | 12/2013 | Kwak et al. | |
| 2014/0063739 A1 | | 3/2014 | Liu et al. | |
| 2015/0022972 A1 | | 1/2015 | Kwon | |
| 2016/0037677 A1 | | 2/2016 | Yamanaka et al. | |
| 2017/0084516 A1 | * | 3/2017 | Harada | H05K 7/20909 |
| 2019/0166729 A1 | | 5/2019 | Kitanaka et al. | |
| 2020/0335423 A1 | * | 10/2020 | Sugimoto | H01L 23/467 |

* cited by examiner

Primary Examiner — Zachary Pape
(74) *Attorney, Agent, or Firm* — Greenberg Traurig, LLP

(57) ABSTRACT

A cooling system for power semiconductor switches is provided. The cooling system includes a heat sink that is pressed against the power semiconductor switch. A plenum is also provided with an opening through a wall thereof which is aligned with the heat sink. A fan draws air through or around the heat sink and through the plenum wall opening and the plenum in order to cool the power semiconductor switch.

17 Claims, 7 Drawing Sheets

POWER SEMICONDUCTOR COOLING SYSTEM

BACKGROUND

The present inventions relate generally to power semiconductors, and more particularly, to a cooling system for power semiconductor switches.

Power semiconductor switches are used in a variety of devices to control electric power flowing to electrical loads. Due to the high voltages and currents flowing through a power semiconductor switch, it is preferable to cool such devices to prolong the life of the device and prevent failures. Although a variety of cooling systems exist for electric devices using power semiconductor switches, such systems suffer from numerous problems, including non-uniform cooling, inefficiency, reliability and maintenance concerns. Conventional cooling systems also typically require a large amount of space which may make it difficult to provide smaller, compact electric devices with power semiconductor switches. Thus, the inventors believe an improved cooling system for power semiconductor switches would be desirable.

SUMMARY

A cooling system is described for cooling power semiconductor switches in electric devices, such as a static transfer switch. Heat generated by the power semiconductor switch is at least partially absorbed by one or more heat sinks pressed against the power semiconductor switch, for example, with a clamp. This heat sink is aligned with an opening through a wall of a plenum. A fan draws air through the plenum wall opening and the plenum. As a result, the heat sink is cooled by the airflow directed through or around the heat sink. The invention may also include any other aspect described below in the written description or in the attached drawings and any combinations thereof.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
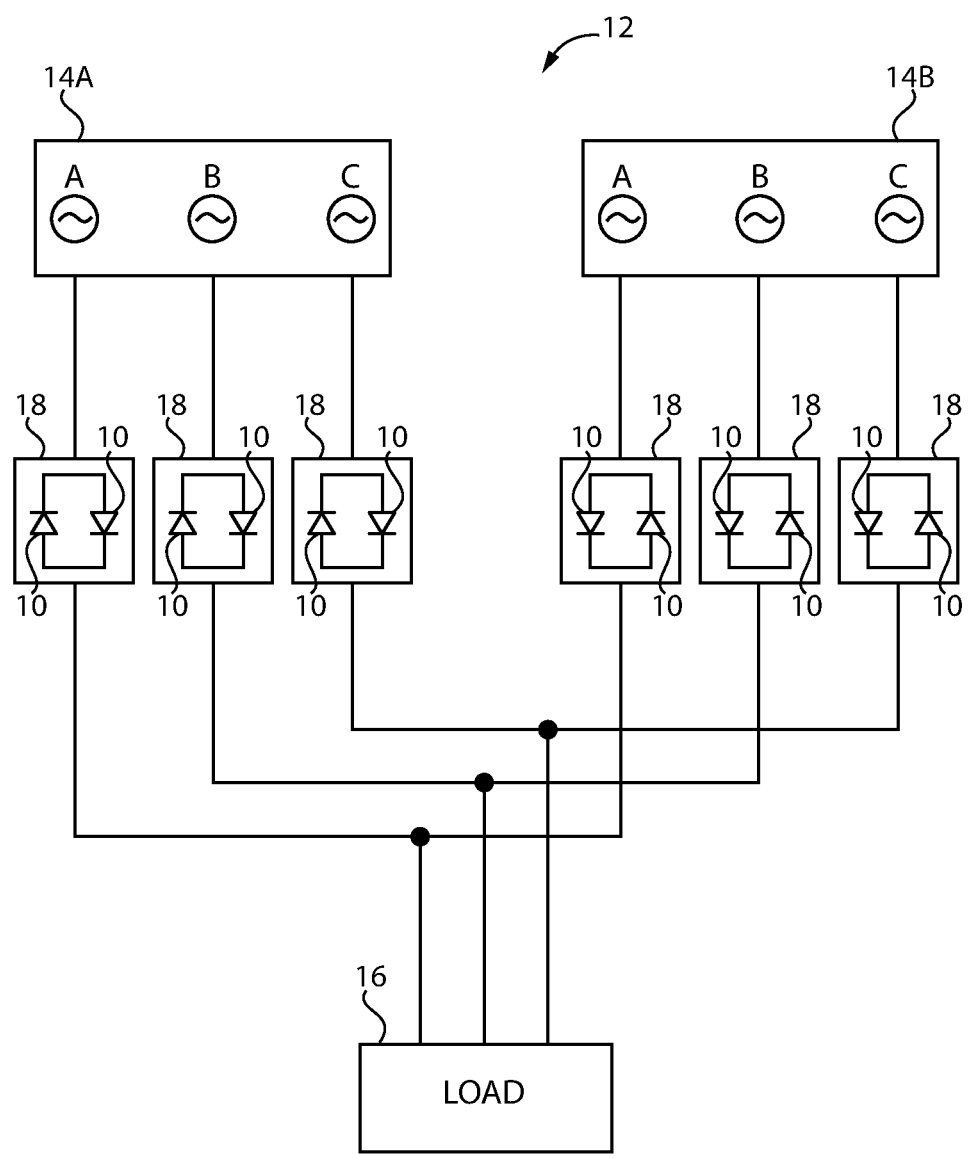
FIG. 1 is an electrical schematic of a static transfer switch.
Figure 2:
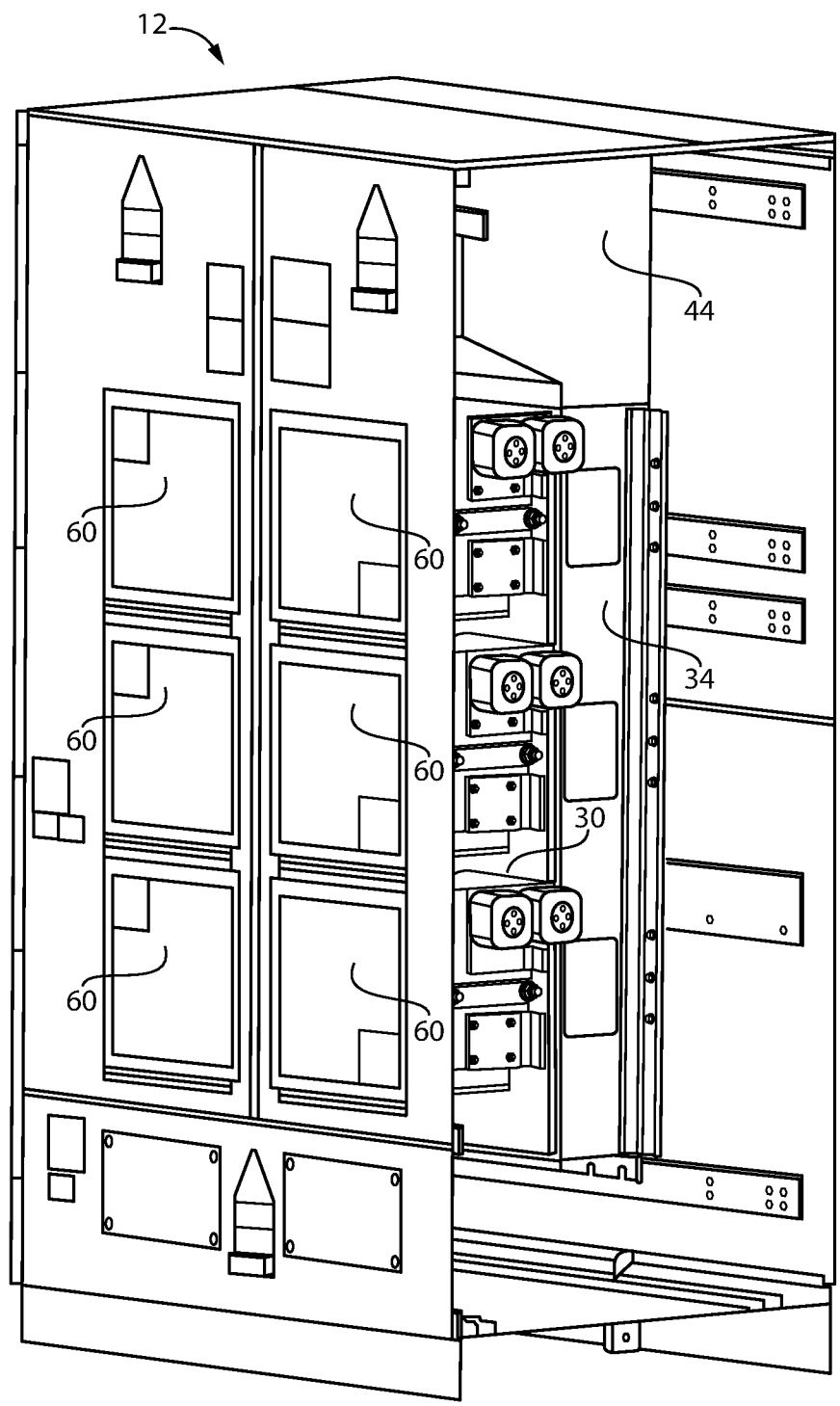
FIG. 2 is a cutaway perspective view of the static transfer switch.
Figure 3:
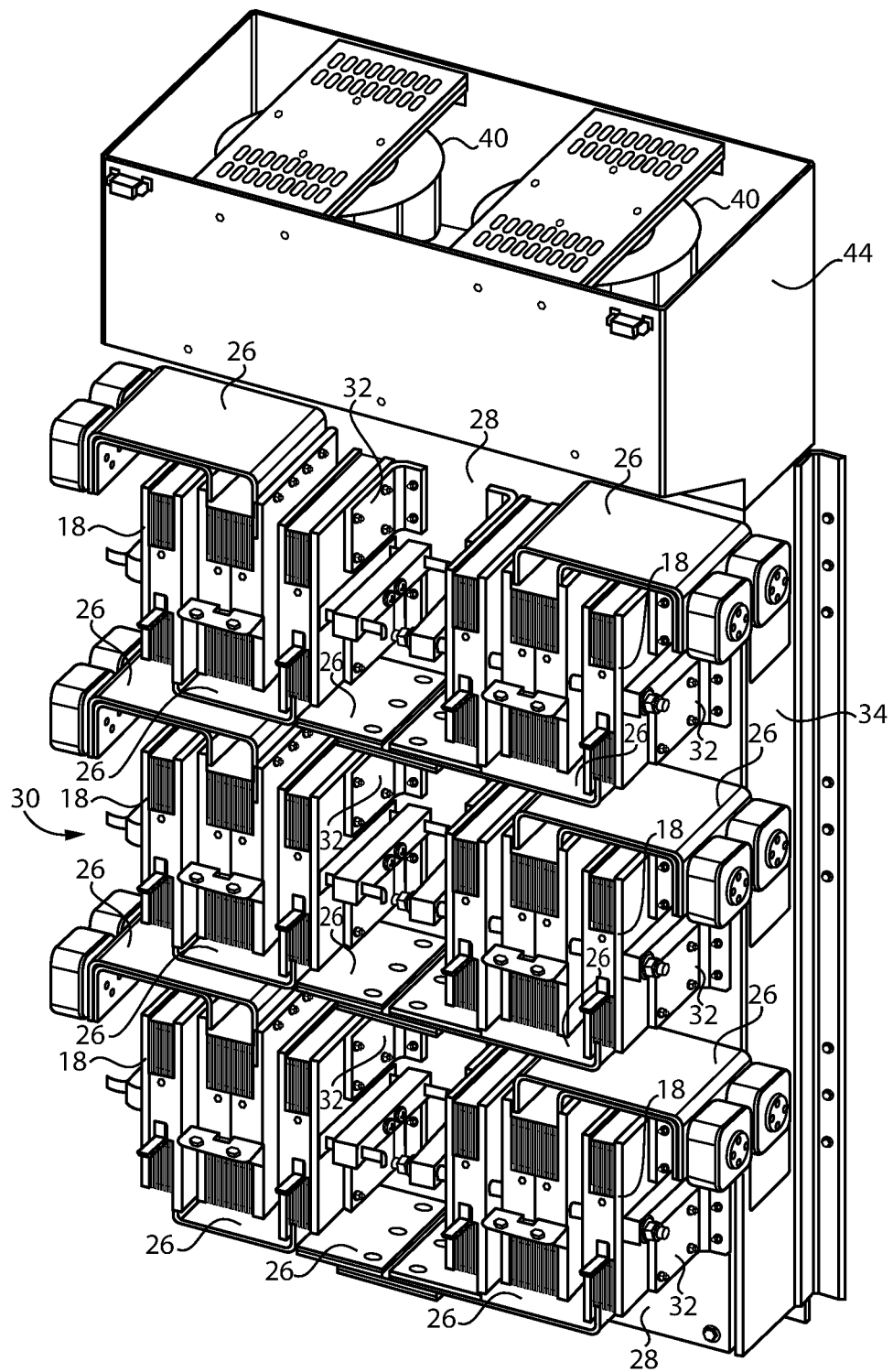
FIG. 3 is a perspective view of the internal structure of the switching housing.
Figure 4:
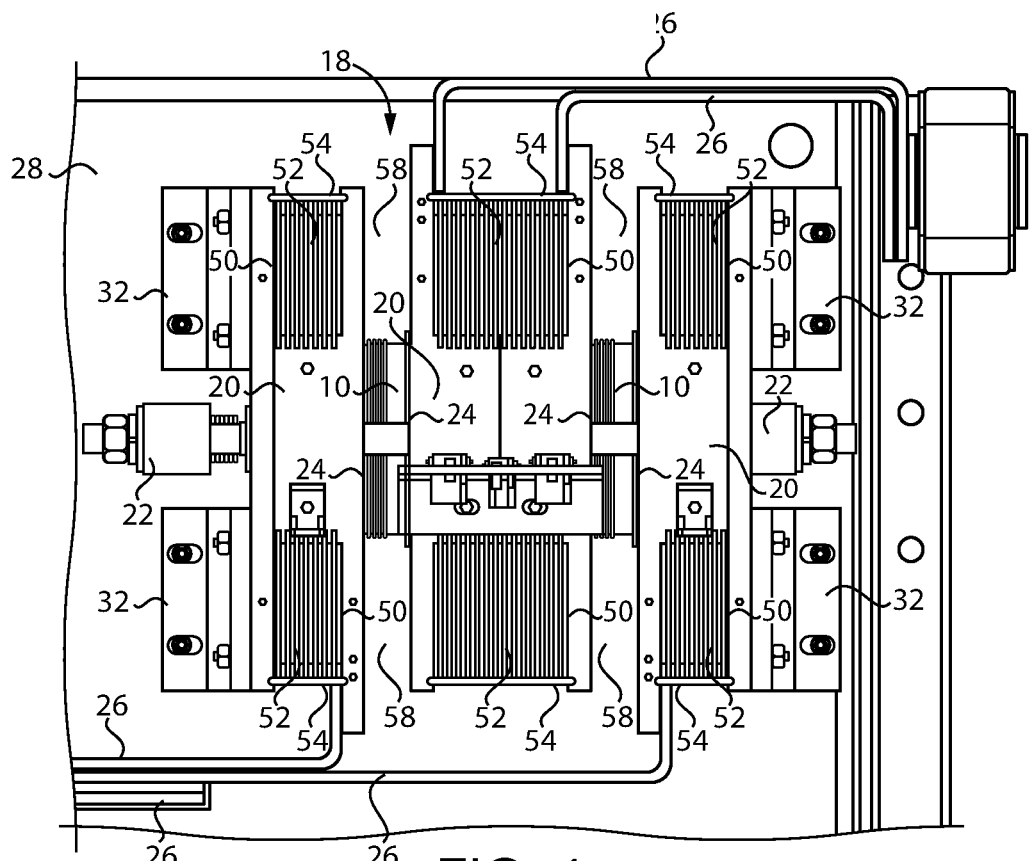
FIG. 4 is a plan view of a switching module.
Figure 5:
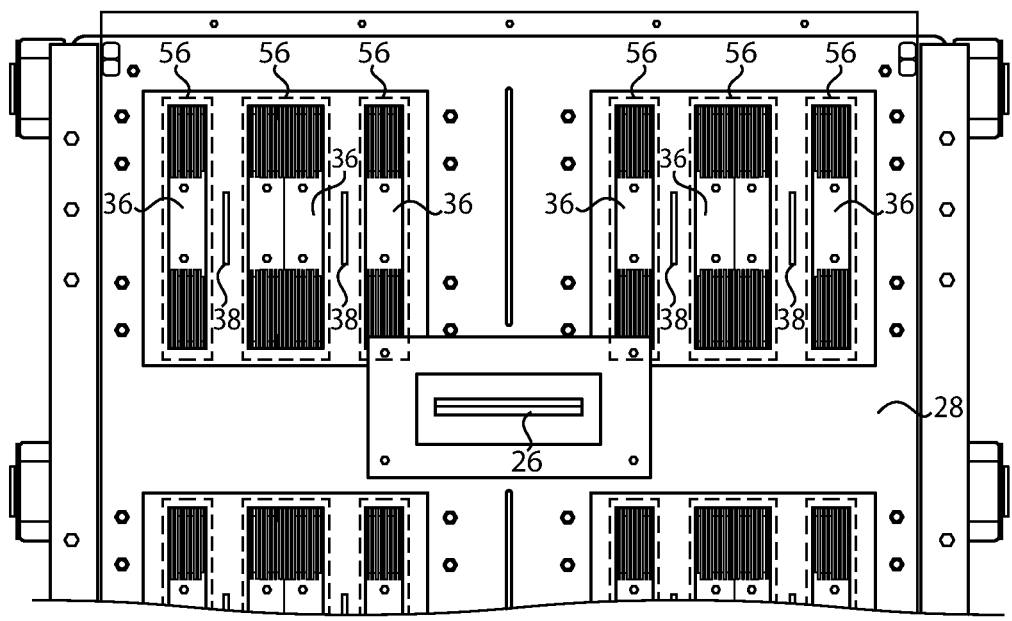
FIG. 5 is a plan view of a portion of the inside of the plenum wall.
Figure 6:
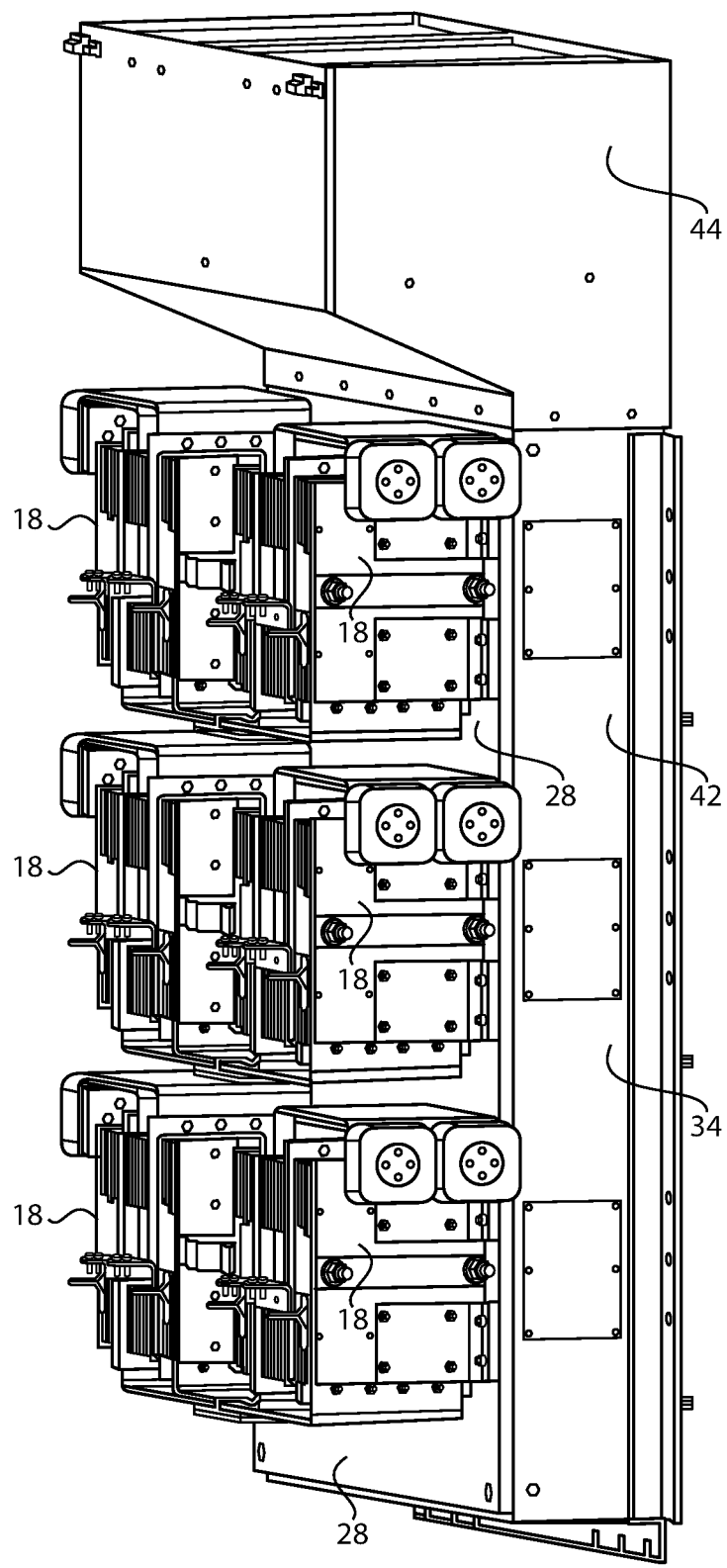
FIG. 6 is another perspective view of the internal structure of the switching housing showing the plenum behind the switching housing.
Figure 7:
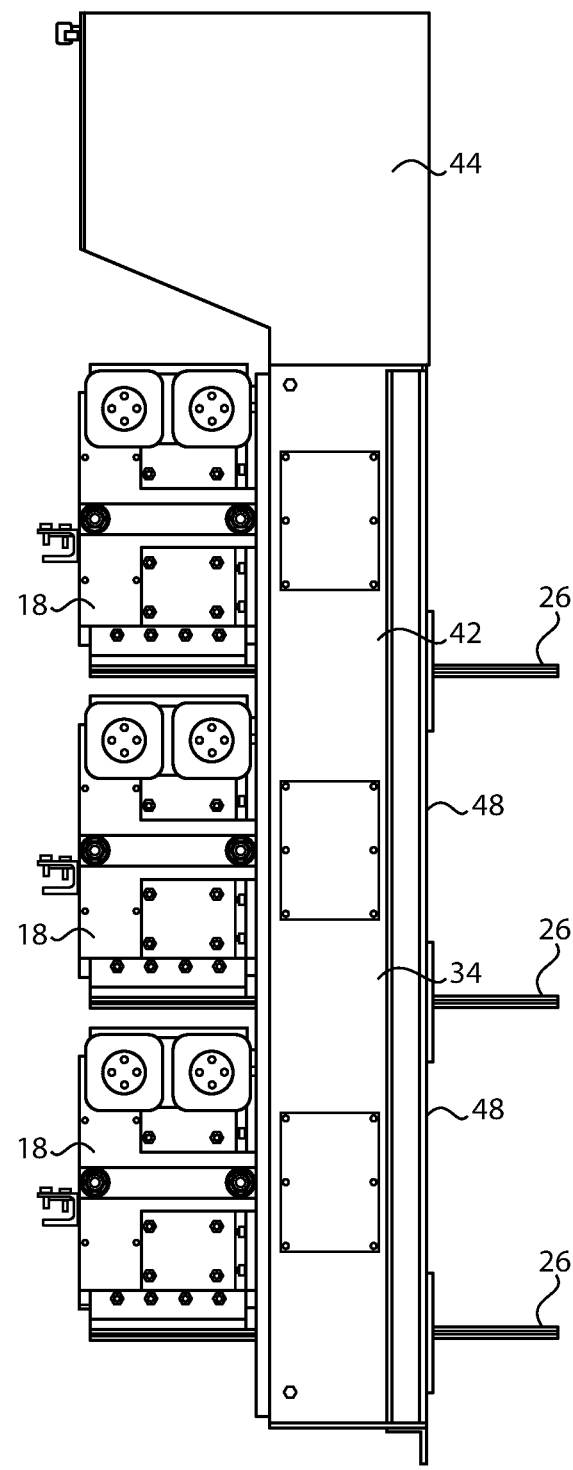
FIG. 7 is a side view of the switching modules and the plenum.
Figure 8:
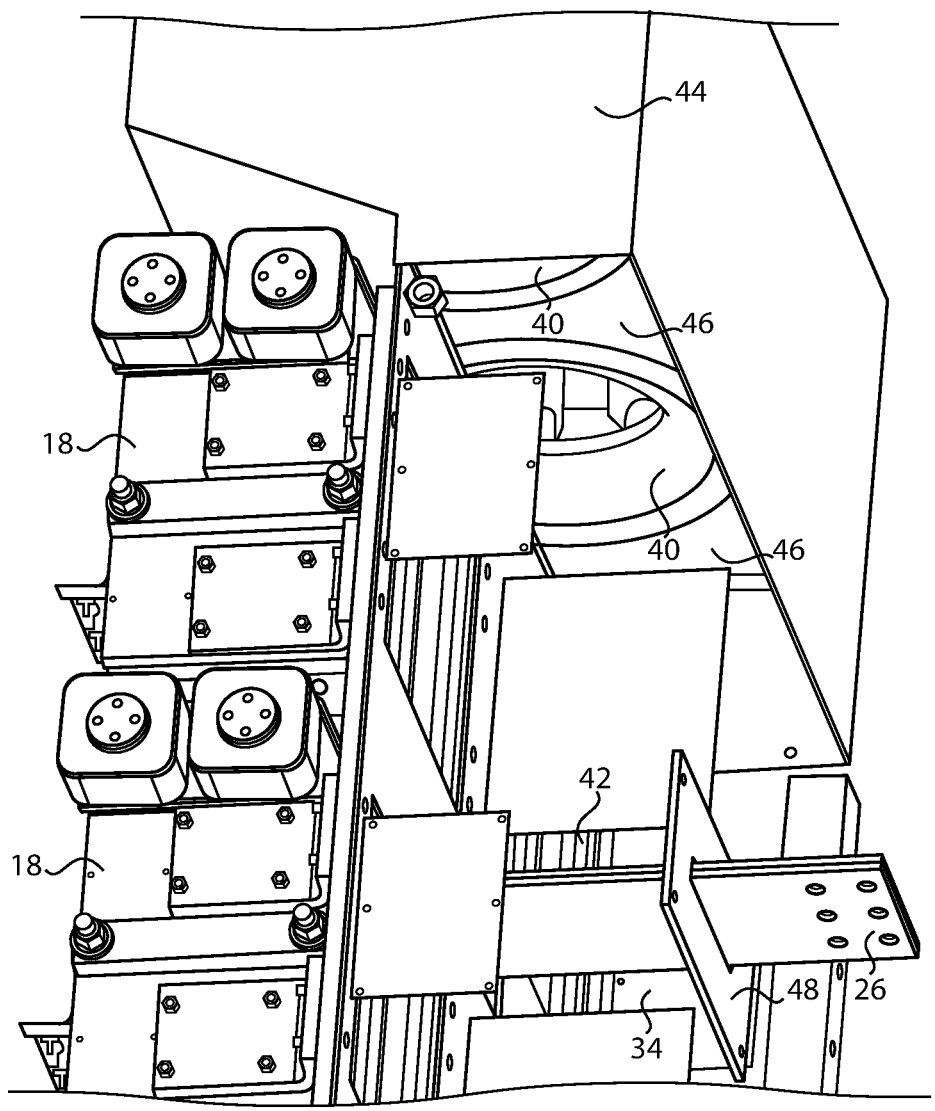
FIG. 8 is a cutaway internal view of a portion of the plenum.

Referring now to the drawings, the cooling system described herein is particularly useful for cooling power semiconductor switches 10, such as thyristors, IGBTs, GTOs, IGCTs, etc. As understood in the art, power semiconductor switches 10 are used to control power voltages and currents supplied to electrical loads, in contrast to logic circuits or the like. Because of the large voltages and currents flowing through power semiconductor switches 10, power semiconductor switches 10 can become very hot during use. Therefore, it is preferable to provide an active cooling system in order to reduce the temperature of power semiconductor switches 10 when in use.

Although power semiconductor switches 10 are used in a variety of electric devices, one device where power semiconductor switches 10 may be used is a static transfer switch 12. Static transfer switches 12 control electric power flow from two or more different electric power sources 14A, B to a power output 16 connected to an electric load. Static transfer switches 12 are typically used for critical electrical loads like data centers where it may be necessary to switch to an alternate electric power source 14B quickly (e.g., within a single AC frequency cycle) when the power supply from the primary source 14A becomes unexpectedly degraded (e.g., a power surge, power drop, etc.). In the example shown in the figures, the static transfer switch 12 may be a three phase AC static transfer switch 12. That is, the static transfer switch 12 is connected to two different power sources 14A, B where each power source 14A, B is an AC power source with three phases. Power semiconductor switches 10 are used to electrically couple a first or second power source 14A, B to the power output 16 which is connected to the electric load. That is, only one of the power sources 14A is coupled to the power output 16 at a particular time, while the other power source 14B is disconnected from the power output 16. Thus, in the three phase static transfer switch 12 in the figures, separate power semiconductor switches 10 are used for each phase and each power source 14A, B. Further, it is preferred that two power semiconductor switches 10 are paired together in an anti-parallel arrangement to effectively switch positive and negative AC voltages. Therefore, the three phase AC static transfer switch 12 has six switching modules 18 (i.e., three modules 18 for each power source 14A, B and one module 18 for each phase of a power source 14). Each of the modules 18 may have two anti-parallel power semiconductor switches 10 to switch AC power, which means the static transfer switch 12 may have a total of twelve power semiconductor switches 10 therein.

In view of the commonality of the switching modules 18, only one of the switching modules 18 is described in detail. Preferably, each module 18 has three heat sinks 20 with the power semiconductor switches 10 being sandwiched between the heat sinks 20. That is, two of the heat sinks 20 are on the outside pressed against the outer side of the respective power semiconductor switch 10, and the two power semiconductor switches 10 are pressed against opposite sides of the middle heat sink 20. Threaded rods 22 may be used as a clamp to squeeze the heat sinks 20 and the power semiconductor switches 10 together. In this arrangement, the heat sinks 20 may be used as electrical conductors to supply electric power or draw electric power from the electrical contacts 24 of the power semiconductor switches 10. That is, each of the opposite side surfaces 24 of a power semiconductor switch 10 constitutes an electrical contact 24. Electrical connectors 26 attached to the heat sinks 20 are also provided for coupling each heat sink 20 to a power source 14 or power output 16. It may be desirable for one of the connectors 26 (e.g., the power output connector 26) to extend through the plenum wall 28, the plenum 34 and the back wall 48 of the plenum 34 to allow the exposed connector 26 to be located at the back of the static transfer switch 12. It is understood that when a power semiconductor switch 10 is electrically on, electric power flows from the power source 14 through one heat sink 20 to one of the electrical contacts 24, through the switch 10 to the other electrical contact 24, and through the other heat sink 20 to the power output 16.

The switching modules 18 may be mounted to a wall 28 within a switching housing 30 with brackets 32 attached to the heat sinks 20 and the wall 28. Preferably, the wall 28 is made of an insulative material so that the electrically energized heat sinks 20 remain electrically isolated from each other. In addition to defining a wall 28 of the switching housing 30, the wall 28 also defines a plenum wall 28 where the plenum 34 is on the opposite side of the wall 28 from the switching modules 18. The plenum 34 may be enclosed around the sides and the bottom. Openings 36, 38 through the plenum wall 28 provide air flow communication between the switching housing 30 and the plenum 34. One or more fans 40 are also provided to force air flow through or around the heat sinks 20 and through the plenum wall openings 36, 38 from or to the plenum 34. The fans 40 force air flow out of or into the plenum 34.

In the preferred embodiment, the fans 40 are located in a portion 44 of the plenum 34 (i.e., a portion that is in direct communication with the plenum 34). In order to use fans 40 that are larger in size than the width of the plenum 34, it may be possible for the fans 40 to be located in a second portion 44 of the plenum 34 with a larger cross-sectional area than the first portion 42 of the plenum 34 which extends along the plenum wall 28. In order to make the static transfer switch 12 more compact, it may also be desirable for the larger, second portion 44 of the plenum 34 to be above (or otherwise extending beyond) the switching housing 30 and overlapping the plenum 34 and the switching housing 30 (including the power semiconductor switches 10 and heat sinks 20). Thus, a wider cross-sectional portion 44 of the plenum 34 may be provided for the fans 40 while not increasing the thickness of the static transfer switch 10 in the direction of the switching housing 30 and the plenum 34. Preferably, a divider 46 is also provided around the fans 40 to enclose the main portion 42 of the plenum 34 from the exhaust portion 44 to ensure that air cannot bypass around the fans 40 back into the plenum 34.

It may also be desirable for at least two fans 40 to be provided together side-by-side within the plenum 34. This provides a degree of redundancy in the cooling system in that, even if one fan 40 malfunctions and quits working, the other fan 40 will continue to draw air through the switching housing 30 and the plenum 34 without any particular switching module 18 being more affected than the other switching modules 18. With the fans 40 being located in the plenum 34, it may also be possible to eliminate any fans from within the switching housing 30. This may be desirable so that when maintenance is being performed on the switching modules 18 the fans 40 do not obstruct the modules 18, which could require temporary removal. With no fans in the switching housing 30, maintenance personnel also do not need to be concerned with inadvertent contact with rotating blades of the fans 40.

Although it is possible for the fans 40 or auxiliary fans to blow air into the switching housing 30, it is preferable for the fans 40 to suck air out of the switching housing 30 and to be located in an exhaust portion 44 of the plenum 34. That is, hot air is drawn out of the switching housing 30 from the heat sinks 20 and through the heat sink openings 36 in the plenum wall 28. The hot air is then drawn from the main portion 42 of the plenum 34 by the fans 40 out the exhaust portion 44. Air inlets 60 may be provided through the switching housing 30 directly across from the openings 36, 38 in the plenum wall 28 (e.g., at the front side of the static transfer switch 12). As a result, a negative pressure is generally evenly spread within the switching housing 30.

In order to direct airflow over the heat sinks 20, the heat sink openings 36 in the plenum wall 28 may be aligned with the heat sinks 20. That is, the air which flows through the heat sink openings 36 first flows through or around the respective heat sink 20. Although it may be possible to provide one large heat sink opening 36 for each switching module 18, it is preferable to provide separate heat sink openings 36 for each heat sink 20 sized according to the respective heat sink 20. Thus, where each switching module 18 has three heat sinks 20, the plenum wall 28 may have three heat sink openings 36 for each switching module 18. Each of the heat sinks 20 may have a channel 50 extending therethrough which may be oriented transversely, or perpendicular to, the plenum wall 28. Preferably, two channels 50 may be provided through each heat sink 20 on opposite sides of the heat sink 20. The channels 50 may be aligned with the respective heat sink opening 36 so that air flows through the channel 50 as it travels to the heat sink opening 36 and the plenum 34. This further directs that airflow through the heat sink 20 to efficiently dissipate heat therefrom. Preferably, cooling fins 52 are located within the cooling channels 50 for heat dissipation. The cooling channels 50 may also be fully enclosed around the circumference thereof with a plate 54 on top of the channel 50 to form a tunnel through the heat sink 20. A seal 56 may also be provided between the heat sink 20 and the heat sink opening 36 to ensure that only air flowing through or around the heat sink 20 flows through the opening 36.

Openings 38 may also be provided through the plenum wall 28 to directly dissipate heat from the power semiconductor switches 10. In the preferred embodiment, the heat sinks 20 are laterally wider than the power semiconductor switches 10 sandwiched therebetween. As a result, a channel 58 is formed on each side of the power semiconductor switch 10 between the heat sinks 20. It is further noted that, although the heat sinks 20 may be close to or touching the plenum wall 28 (where it is insulative), the power semiconductor switches 10 are located further from the plenum wall 28 due to their smaller width (e.g., diameter) creating a gap therebetween. Thus, in order to directly dissipate heat from the power semiconductor switches 10, respective switch openings 38 aligned with each switch 10 may be provided through the plenum wall 28. As a result, the switch openings 38 may be interspersed between the heat sink openings 36.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A cooling system for a power semiconductor switch, comprising:
a heat sink pressed against the power semiconductor switch;
a plenum comprising a plenum wall with a first opening therethrough, the heatsink being aligned with the first opening; and
a fan in communication with the plenum,
wherein the fan is configured to:
flow cooling air through or around the heat sink,
flow the cooling air through the first opening in the plenum wall and through the plenum, and
flow the cooling air out of or into the plenum,
wherein the heat sink comprises a first channel extending therethrough,
wherein the first channel being aligned with the first opening in the plenum wall, and
wherein the first channel is enclosed around a circumference thereof.

2. The cooling system according to claim 1, wherein the heat sink is mounted to the plenum wall.

3. The cooling system according to claim 2, wherein the plenum wall is made of an insulative material, the heat sink mounted to the plenum wall thereby being electrically isolated.

4. The cooling system according to claim 1, further comprising a seal between the heat sink and the first opening in the plenum wall.

5. The cooling system according to claim 1, wherein the first channel comprises cooling fins therein.

6. The cooling system according to claim 1, wherein the fan is disposed at an outlet of the plenum.

7. The cooling system according to claim 6, wherein the fan draws air from the heat sink into the plenum through the first opening in the plenum wall and out of the plenum.

8. The cooling system according to claim 1, wherein the heat sink and the power semiconductor switch are disposed within a housing separated from the plenum, the fan generating negative pressure within the housing.

9. The cooling system according to claim 1, further comprising a divider disposed between the fan and the plenum, the fan being disposed at an exhaust and the divider preventing exhaust air from bypassing the fan and reentering the plenum.

10. The cooling system according to claim 1, further comprising at least two of the fan arranged side-by-side.

11. The cooling system according to claim 1, wherein the heat sink and power semiconductor switch are disposed within a housing separated from the plenum, the housing having no fans therein.

12. A static transfer switch comprising the cooling system of claim 1, wherein the power semiconductor switch electrically couples one of two power sources to a power output.

13. A three phase AC static transfer switch comprising the cooling system of claim 1, and further comprising six of the power semiconductor switch and six of the heat sink, each heat sink being pressed against a respective power semiconductor switch, each of three of the power semiconductor switches electrically coupling respective phases of a first three phase power source to a power output, and each of three others of the power semiconductor switches electrically coupling respective phases of a second three phase power source to a power output.

14. A cooling system for a power semiconductor switch, comprising:
a heat sink pressed against the power semiconductor switch;
a plenum comprising a plenum wall with a first opening therethrough, the heatsink being aligned with the first opening; and
a fan in communication with the plenum,
wherein the fan is configured to:
flow cooling air through or around the heat sink,
flow the cooling air through the first opening in the plenum wall and through the plenum, and
flow the cooling air out of or into the plenum,
wherein the power semiconductor switch is pressed between two of the heat sink, the power semiconductor switch being smaller in width than each of the two heat sinks such that a second channel is formed between the two heat sinks and the power semiconductor switch, and further comprising a second opening through the plenum wall aligned with the power semiconductor switch.

15. A cooling system for a power semiconductor switch, comprising:
a heat sink pressed against the power semiconductor switch;
a plenum comprising a plenum wall with a first opening therethrough, the heatsink being aligned with the first opening;
a fan in communication with the plenum,
wherein the fan is configured to:
flow cooling air through or around the heat sink,
flow the cooling air through the first opening in the plenum wall and through the plenum, and
flow the cooling air out of or into the plenum; and
three of the heat sink and two of the power semiconductor switch, each of the power semiconductor switches being pressed between two of the heat sinks such that one heat sink is pressed between the two power semiconductor switches and two of the heat sinks are each pressed against an outer side of a respective one of the two power semiconductor switches.

16. The cooling system according to claim 15, further comprising three of the first opening in the plenum wall, each of the first openings being aligned with a respective one of the heat sinks.

17. A cooling system for a power semiconductor switch, comprising:
a heat sink pressed against the power semiconductor switch;
a plenum comprising a plenum wall with a first opening therethrough, the heatsink being aligned with the first opening; and
a fan in communication with the plenum,
wherein the fan is configured to:
flow cooling air through or around the heat sink,
flow the cooling air through the first opening in the plenum wall and through the plenum, and
flow the cooling air out of or into the plenum; and
an electrical connector electrically coupled to the power semiconductor switch extending through the plenum wall, the plenum and a back wall of the plenum.

* * * * *